(12) United States Patent
Baik et al.

(10) Patent No.: US 6,365,230 B1
(45) Date of Patent: Apr. 2, 2002

(54) METHOD OF MANUFACTURING A DIAMOND FILM COATED CUTTING TOOL

(75) Inventors: Young Joon Baik, Seoul; Wook-Seong Lee, Euijeongbu; Kwang Yong Eun, Seoul; Ki Woong Chae, Chunan, all of (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 09/459,026

(22) Filed: Dec. 10, 1999

(30) Foreign Application Priority Data

Apr. 9, 1999 (KR) ............................. 99/12546

(51) Int. Cl.⁷ ............................ C23C 16/27; B05D 3/02
(52) U.S. Cl. ............................ 427/249.8; 427/249.11; 427/577; 427/314
(58) Field of Search ............................ 427/314, 249.8, 427/249.12, 249.11, 577; 428/408; 407/119

(56) References Cited

U.S. PATENT DOCUMENTS

| | | | |
|---|---|---|---|
| 5,068,148 A | * 11/1991 | Nakahara et al. ........... | 428/335 |
| 5,236,740 A | 8/1993 | Peters et al. | |
| 5,370,944 A | * 12/1994 | Omori et al. ............... | 428/565 |
| 5,435,815 A | 7/1995 | Ikegaya et al. | |
| 5,543,210 A | 8/1996 | Kullander et al. | |
| 5,560,839 A | 10/1996 | Bennett et al. | |
| 5,567,526 A | 10/1996 | Peters et al. | |
| 5,585,176 A | 12/1996 | Grab et al. | |
| 5,596,813 A | 1/1997 | Olson, Jr. et al. | |
| 5,618,625 A | 4/1997 | Okamura | |
| 5,635,256 A | 6/1997 | Olson | |
| 5,643,523 A | 7/1997 | Simpson | |
| 5,648,119 A | * 7/1997 | Grab et al. ............ | 427/249.13 |
| 5,653,378 A | 8/1997 | Olson, Jr. et al. | |
| 5,660,881 A | 8/1997 | Okamura | |
| 5,667,344 A | 9/1997 | Simpson et al. | |
| 5,674,620 A | 10/1997 | Puiia et al. | |
| 5,713,133 A | 2/1998 | Bhat et al. | |
| 5,716,170 A | * 2/1998 | Kammermeier et al. .... | 408/145 |
| 5,718,948 A | * 2/1998 | Ederyd et al. ......... | 427/249.18 |
| 5,955,212 A | * 9/1999 | Matsumoto et al. ... | 427/249.18 |

\* cited by examiner

Primary Examiner—Bret Chen
(74) Attorney, Agent, or Firm—Scully, Scott, Murphy & Presser

(57) ABSTRACT

In order to provide an excellent toughness and a sufficient adhesive force without any limit in the content of other carbides in the substrate material and Co and in the size of the cemented carbides grains, the present invention provides a diamond film coated cutting tool, comprising a surface layer which cemented carbide grains are grown abnormally on the cemented carbide substrate, and a diamond film formed on the surface layer, and also a method for manufacturing a diamond film coated cutting tool, comprising the steps of heat-treating a surface of a cemented carbide substrate under a decarburizing atmosphere until the surface changes to a η phase, heat-treating the surface-decarburized cemented carbide substrate under a carburized atmosphere, depositing a diamond film on the carburized surface of the cemented carbide substrate.

6 Claims, 5 Drawing Sheets

METHOD OF MANUFACTURING A DIAMOND FILM COATED CUTTING TOOL

BACKGROUND OF THE INVENTION

1. Field of the Invention

The present invention relates to a diamond film coated cutting tool and a manufacturing method thereof, and in particular to a diamond film coated cutting tool which provides and excellent adhesive force enabling machining of a hard workpiece.

2. Description of the Background Art

Generally, a workpiece which is not easily machined by conventional tools is a nonferrous metal such as Al—Si alloy or Cu, a composite material, and a semi-sintered material such as a graphite, a polymer composite material, ceramics, etc. In order to machine these kinds of hard workpieces, a diamond which has the highest hardness value among the existing materials is generally used. Heretofore, the polycrystalline diamond (PCD) cutting tools, which are obtained by brazing a blank (a sintered diamond) to a cemented carbide insert, are widely used for machining certain materials such as Al—Si alloy, etc, which are used as vehicle engine materials. However, a PCD is expensive, and the shape of the same is simple; therefore, it can only be used as an insert shaped tool. In addition, it is very difficult to manufacture a chip breaker which is used for adjusting the chip shape of a workpiece during a cutting operation, and it is difficult to manufacture a tool of complicated shapes like an end mill, drill, reamer, etc., so that the polycrystalline diamond cutting tool is not applicable widely.

In order to completely overcome the above-described problems of the polycrystalline diamond cutting tools, a method for vapor-depositing a diamond film on a substrate was disclosed. Namely, when depositing a diamond film on a certain shaped substrate (insert of a chip breaker type, grill, end mill, etc.) so that the deposited diamond film may have a diamond structure, it is possible to obtain a superior wear-resistance to the conventional polycrystalline diamond tool and to decrease the fabrication cost significantly.

A cemented carbide material, consisted of a tungsten carbide(WC) grain and a cobalt(Co) which is a binder material, is an ideal substrate material for a coated tool. As a binder, Co is added by 6~20 wt %, and other carbide materials such as TiC, TaC, NaC, VC, etc. are added by a few wt % to tens wt % in order to control a mechanical properties such as a toughness, a Near-resistance, etc. Since this material has a toughness adapted for a tool, it is generally used as a substrate material for a coated tool. Thus, it is very important to develop a cutting tool which is coated with diamond on the cemented carbide material having the above-mentioned properties and a fabrication method thereof.

The kinds of chemical vapor deposition (CVD) methods for coating the diamond film are a hot filament CVD, a microwave plasma CVD, a DC plasma CVD, a DC arc-jet CVD, etc, and the diamond film is coated in a state of dissociating a mixed gas of a hydrocarbon such as methane, etc and hydrogen by plasma or thermal energy. When depositing the diamond film on the cemented carbide substrate using the above-described method, the biggest problem is that an adhesive force between the diamond film and the substrate material is very weak irrespective of the deposition method of the diamond film. Subsequently, a premature flaking of the diamond film, i.e. the diamond film having a weak adhesive force is delaminated before a full wear of the diamond film is made, occurs. Therefore, a method to prevent delamination problems of the diamond film during the use of the tool must be developed priorly by enhancing the adhesive force between the diamond film and the cemented carbide substrate material.

In order to overcome the above-described problems, various methods were disclosed for enhancing the adhesive force between the diamond film and cemented carbide substrate material. These methods are based on eliminating any effects of the Co used as a binder material in the cemented carbide substrate material, and enhancing a surface roughness of the substrate material to increase the mechanical interlocking with the diamond film. Since Co acts as a catalyst in transforming a diamond to graphite, Co expedites the graphitization of the diamond during a deposition of the diamond, thereby decreasing the adhesive strength of the diamond film. Therefore, it is required to eliminate any effects of the Co for a diamond film coated tool.

Considering the above-described points, there is provided a method of etching the Co phase of a cemented carbide surface portion by a certain depth to eliminate any effects of the Co, and then etching the cemented carbide grain using a Murakami solution to protrude the cemented carbide grain from the surface, so as to enhance the mechanical interlocking between the diamond film and the substrate material. That is, the etching of the cemented carbide grains as well as the etching of the Co phase makes the surface of the substrate material protruded, and forms many fine windings so as to enhance the mechanical interlocking between the diamond film and the substrate material. The adhesive force of the diamond film can be increased from 60 kg to 100 kg as confirmed by the a Rockwell A indentation test. The etching thickness of the Co layer by 2~15 $\mu$m is required so as to completely eliminate any effects of the Co when the diamond film is coated. Therefore, the portion in which the Co phase acting as the binder material exists remains in a three-dimensionally connected holes (similarity to void in a sponge) by the etching depth from the surface. These voids may decrease the mechanical strength of the surface of the substrate material for thereby causing premature flaking of the diamond, therefore decreasing the life span of the tool. When checking the performance test of a commercial diamond film coated cutting tool, the cutting performance has a wide distribution. In particular, in the case of an interrupted cutting operation or cutting operation of Al alloy having a large amount of Si, the premature flaking of the diamond film is too high.

Also, in order to enhance a mechanical interlocking with the diamond film, there are provided a method of heat treating the substrate under a vacuum or an inert gas atmosphere to significantly decrease the concentration of Co phase on the substrate surface and a method of carburizing cemented carbide grains of the substrate surface to refine the cemented carbide grains or grow a cemented carbide grain for thereby increase the cemented carbide grain size. U.S. Pat. No. 5,623,256 discloses a method of easily evaporating Co of the cemented carbide grains surface by a heat treatment under a nitrogen or hydrogen atmosphere, and a method of forming Co carbides using a carbon atmosphere in a vacuum furnace and then passivating the carbides. In addition, the U.S. patent discloses that during the heat treatment, the grains are grown, which is used for increasing the adhesive force of the diamond film. U.S. Pat. No. 5,068,148 discloses that when the cemented carbide substrate is polished into a final shape, the cemented carbide grains of the substrate surface exist in a broken shape, and that since the diamond film is coated thereon thereafter, the adhesive force of the diamond film is decreased. Therefore, the U.S. patent provides a method of heat-treating the substrate materials at 1000° C. to 1600° C. under a vacuum or a non-oxidizaing atmosphere to melt the broken cemented grains for thereby forming the grown cemented carbide grains on the substrate surface. Thus, the adhesive force of the diamond film increases. However, in order to eliminate any effects of the Co, this patent employs an etching as well as heat treatment method to elimintate the Co layer of the substrate surface.

In a similar manner as U.S. Pat. Nos. 5,623,256 and 5,068,148, U.S. Pat. No. 5,585,176 discloses a method of heat-treating the cemented carbide substrate material at 1510° C. under a nitrogen atmosphere to increase the cemented carbide grain size of the substrate surface and increase the surface roughness by 25~40 pinches, and then coating the diamond film, so as to obtain a diamond film coated tool having a thickness of 22~100 µm with an excellent adhesive force. In this method, the adhesive force of the diamond film amounts to 100 kg by the Rockwell A indentation test without premature flaking. In addition, in this method, since voids are not formed at the portion in which the Co binder phase exists unlikely from the etching method, it is possible to prevent the decrease of mechanical strength of the substrate material in the grain boundary area. However, this patent has a problem that the substrate grain size of the internal portion as well as the substrate grain size of the surface portion is increased so that the grain size is distributed 1 to 11 µm, and that the heat treatment time longer than 2~3 hours is required. That is, the substrate grain growth of the internal portion is unavoidable. When the substrate grain size of the internal portion is changed during the heat treatment, the mechanical properties of the substrate material may also change. Therefore, in order that a fine structure should not be changed so as not to change the mechanical proprerties of the substrate material, it is required to grow only the desirable grains within a short period at a temperature as low as possible.

Also, this patent has a limit in the chemical composition of an adaptable substrate material. First, other carbide materials such as Ti, Ha, Ta, Nb, V, Mo, Cr must be added to WC—Co by below 1 wt %, because in the case that an additive is contained more than the specific amount, it is difficult to obtain the grain growth on the surface. In addition, the content of Co is limited to preferably no more than 7%.

The problems for enhancing the adhesive force of the diamond film coated cemented carbide tool is as follows. First, there is a limit in the cemented carbide substrate material for coating. As the utilization condition of the tool such as an interrupted cutting operation becomes difficult, a tool with a good toughness is required. Therefore, the cemented carbide substrate material with a composition of 10% to 15% Co is required. However, the present technologies applies only to C2 grade in which the Co content is no more than 7%. Second, as described above, the contents of other carbide added to the cemented carbide is limited.

Consequently, the effectiveness of etching method and heat treatment method for adhesion enhancement depends on the composition of other carbide. Therefore, even in the same C2 grade, the type of the substrate materials is limited. Third, the present technologies depends largely upon the cemented carbide grain size of the substrate material. Therefore, the present technologies applies only to the substrate material having a size of the cemented carbide grain no less than 1 µm. However, a method applicable to a micrograin cemented carbide substrate material composed of a sub-micron size cemented carbide material is required.

That is, the method for enhancing the adhesive force between the diamond film and the cemented carbide substrate is intensively studied by many researchers. However, a manufacturing method for the diamond film coated tool with an excellent adhesive force which is capable of providing an excellent toughness without any limit in the amount of other carbides in the substrate material and in the cemented carbide grain size of the substrate material, and having little problems for a cutting operation has not yet been developed.

SUMMARY OF THE INVENTION

Accordingly, it is an object of the present invention to provide a diamond film coated cutting tool and a manufacturing method of the same which is capable of providing an excellent toughness and a sufficient adhesive force without any limit in the amount of other carbides in the substrate material and Co and in the size of the cemented carbides grains.

In order to achieve the above object, there is provided a diamond film coated cutting tool, comprising a surface layer which cemented carbide grains are grown abnormally on the cemented carbide substrate, and a diamond film formed on the surface layer.

There is also provided a method for manufacturing a diamond film coated cutting tool, comprising the steps of heat-treating a surface of a cemented carbide substrate under a decarburizing atmosphere until the surface changes to a η phase, heat-treating the surface-decarburized cemented carbide substrate under a carburizing atmosphere to grow surface grains of cemented carbide abnormally, and depositing a diamond film on the carburized surface of the cemented carbide substrate.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1A is the case that the substrate material is heat-treated under Hydrogen (30 min)—Methane (30 min) atmosphere, and FIG. 1B is the case that the substrate material is heat-treated under Hydrogen atmosphere (1 hr);

DETAILED DESCRIPTION OF THE PREFERRED EMBODIMENTS

Figure 1A:
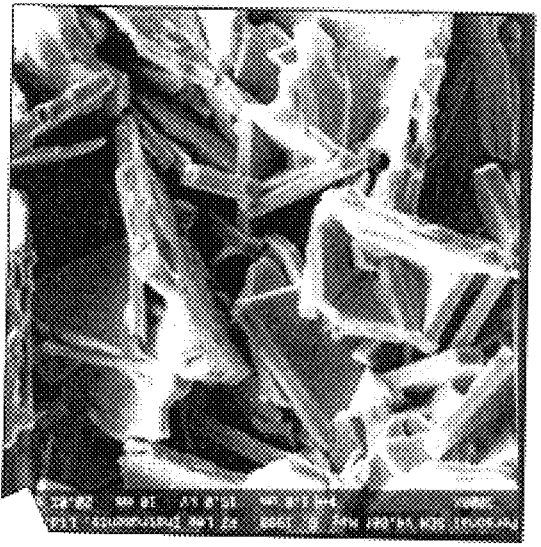
FIGS. 1A and 1B are pictures illustrating a surface morphology of a diamond film of the substrate No. 5 of Table 1 which is heat-treated under 1 torr at 1400° C.

According to the present invention, a diamond film coated cutting tool is capable of providing an excellent toughness and a sufficient adhesive force, by forming a surface layer which cemented carbide grains are grown abnormally on the cemented carbide substrate and a diamond film formed on the surface layer. The surface layer is formed by heat-treating a surface of a cemented carbide substrate under a decarburizing atmosphere until the surface changes to a η phase, heat-treating the surface-decarburized cemented carbide substrate under a carburizing atmosphere to grow surface grains of cemented carbide abnormally, and depositing a diamond film on the carburized surface of the cemented carbide substrate.

Abnormal grain growth means that grains are not grown based on the Ostwald ripening theory, but that a part of grains are grown fast abnormally. According to this abnormal grain growth theory, when WC is decarburized to form a η phase and then heat treated under a carburizing atmosphere, the abnormal grain growth occurs easily. If the decarburizing and carburizing atmospheres are formed in a vapor phase, the abnormal grain growth will occur only on the surface of the substrate.

In the decarburizing step, the carbons of the cemented carbide grains react with hydrogen under a hydrogen atmosphere and form a hydrocarbon, so that the cemented carbide grains may be decarburized, and then the decarburized cemented carbide grains grows abnormally under a carburizing atmosphere by a heat treatment under a hydrocarbon, such as a methane atmosphere.

When the abnormal grain growth occurs in the cemented carbide substrate, the surface roughness of the substrate increases due to the large grain size on the surface. Thus the adhesive force of the deposited film is enhanced by interlocking two phases (diamond film and abnormally grown cemented carbide grains) mechanically at the interface when depositing a diamond film thereon.

In order to fabricate tools in geometric requirement after sintering or in order to decrease the surface roughness of an edge portion, the upper surface and lateral surface of the tool are lapped or polished. Therefore, the surface of the cemented carbide substrate is in the state that cemented carbide grains are broken or the broken pieces of polished cemented carbide during polishing are mixed with Co phase and attached on the surface of the substrate. When depositing the diamond film immediately thereon, the broken pieces attached during polishing should be removed from the substrate. According to the present invention, an additional step for removing the cemented carbide broken pieces is not required because the broken pieces are automatically eliminated during the abnormal grain growth of the surface grains.

The cemented carbide used as a substrate in the present invention is composed of the carbide grain having a high hardness and a metallic binder. The carbide group includes all types of carbide capable of abnormal grain growth such as cubic TiC group, TaC group, etc. as well as hexagonal WC group. As a metallic binder, Co group, Ni group, Fe group, etc. are used in accordance with the kind of the carbide. The following examples according to the present invention is described based on a WC—Co cemented carbide with an excellent toughness as a substrate of the coating tool, but the substrate of the present invention are not limited to the WC—Co cemented carbide.

While the mixing ratio of the Co binder up to 20 wt % is possible, the ratio according to the present invention is mainly classified into the following three categories. The ratio of the first is up to 7% which is a general-used C2 grade, that of the second is 9 to 11%, and that of the third is 14 to 17%. Other carbide formation element such as Ti, Ta, Nb, Cr, Hf, Zr, etc. can be included up to 20 wt %. The method according to the present invention is irrepectively of the amount of additives, and the above three categorized susbtrate are selected based on the kinds of the conventional and generally used tools. The spec of the adapted substrate are shown in Table 1.

TABLE 1

Composition of the cemented carbide substrate and grain size of the cemented carbide.

| Substrate No. | Composition of the base material | Grain size |
| --- | --- | --- |
| 1 | WC - 6% Co | 1–3 μm |
| 2 | WC - 0.4% TaC - 6% Co | 1–3 μm |
| 3 | WC - 0.5% TaC - 7% Co | 1–3 μm |
| 4 | WC - 0.15% TaC - 3.24% Co | 1–3 μm |
| 5 | WC - 2% TaC - 6% Co | 1–3 μm |
| 6 | WC - 3% TaC - 6% Co | 1–3 μm |
| 7 | WC - 9% Co | 1–3 μm |
| 8 | WC - 20% (TiC, TaC) - 10% Co | 1–3 μm |
| 9 | WC - 15% Co | 3–5 μm |

The cemented carbide cutting tool is sintered and machined in various shapes. In the present invention, the substrates are chosen to have a shape of the SPGN 120308 which does not have a chip breaker and the CCGT 120408 which has a chip breaker. The substrate may be used in a sintered state or a polished and surface-brushed state. The present invention is applied irrespective of the surface state such as a sintered state or a polished state.

In the present invention, the process of manufacturing the diamond film coated cutting tool includes a decarburizing heat treatment step for chemically changing the surface phase structure of the cemented carbide substrate, a carburizing heat treatment step for abnormally growing cemented carbide grain using a changed chemical state, a step for modifying the substrate surface in order to implement the nucleation during the diamond film coating, and a step for coating the diamond film.

The decarburizing step for varying a chemical state and the phase structure of the surface layer of the cemented carbide substrate will be explained.

According to the phase diagram of the WC—Co, there are various WC compound such as WC, $W_2C$, κ phase, θ phase, η phase etc. Among them, the phase related to the abnormal grain growth is η phase, and the composition thereof is $Co_3W_3C$. The cemented carbide alloy is manufactured by a liquid phase sintering process, and in the case that the content of carbon is below a certain amount, the η phase is formed so as to decrease a mechanical properties of the cemented carbide alloy. In addition, it is widely known that the η phase causes an abnormal grain growth of the cemented carbide grains. Therefore, it is possible to cause abnormal grain growth by artificially forming the η phase. Since the η phase is a three component compound caused from the deficiency of the content of the carbons, a certain chemical atmosphere must be formed for decreasing the concentration of the carbons in order to form the η phase on the surface of the cemented carbide. Forming the above-described atmosphere on the surface of the sintered body is obtainable by changing the atmosphere surrounding the sintered body. The carbons of the sintered body react with hydrogen and oxygen to form hydrocabon such as $CH_4$, or form CO and $CO_2$ so that the content of carbons of the surface of the sintered body decreases. That is, when heat-treating the sintered body under the above-described hydrogen atmosphere, the η phase is formed on the surface of the sintered body.

Generally, a vacuum furnace for sintering the cemented carbide alloy includes residual air, moisture, etc. in an inner wall of the vacuum furnace and an adiabatic graphite felt. Even after obtaining a predetermined vacuum prior to the sintering, the above-described impurities still remain, and these impurity elements change the sintering atmosphere to the reducing atmosphere of the CO. Therefore, in the case of heat-treating the sintered body under the vacuum atmosphere, it is possible to implement a decarburizing operation on the surface of the sintered body. However, in the decarburizing process such like, it is impossible to obtain a uniform decarburizing because the content of the impurity in the vacuum furnace is not uniform and varies from batch to batch. In addition, a big difference occurs locally in respect to the grain growth depending upon the shape of the cemented carbide cutting tool. For example, in the case of the SPGN type substrate, the grain growth occurs exceedingly at the corner rather compared to the center of a upper surface. These problems incur a critical problem in the case of a three-dimensional substrate such as a complicated shaped tool or a drill which has a chip breaker. Therefore, an atmosphere for implementing a uniform decarburizing reaction is required.

The artificial decarburizing atmosphere may be implemented by adding hydrogen or oxygen. That is, the carbon on the surface layer of the sintered body reacts with hydrogen or oxygen, to decrease the carbon content of the surface of the sintered body. The η phase is formed on the surface of the sintered body from the above-described reaction. In the decarburizing reaction, hydrogen is more advantageous than oxygen in respect to the control of the decarburizing degree. Also, in the case of the oxygen, the oxygen reacts with the graphitic heating element of the vacuum furnace, and thus it is difficult to operate the vacuum furnace. The flux of the hydrogen is 1~100 cc/min which does not have any influence. The decarburizing speed is largely dependent on the pressure of the heat treatment, and the pressure is determined from 0.5 torr to normal pressure. As the pressure is increased, the decarburizing reaction is enhanced. The decarburizing reaction under 1 atm is too rapid and is difficult to control. That is, a preferable pressure range is between 0.5 torr to 5 torr. The decarburizing temperature is preferably in the range of 1300 to 1500° C. As the temperature rises, the reaction is enhanced. A more preferable temperature range is between 1350 to 1450° C. The decarburizing time is preferably between 15 minutes to 1 hour. As the content of other carbides is high and the content of Co is high, the decarburizing time is a little extended, and as the temperature is low and the pressure is low, the decarburizing time is extended. For example, as shown in Table 1, in the case of substrate No. 2, when the decarburizing condition required for growing the surface grain having a grain size of 10 μm is 1425° C., 2 torr, the decarburizing time corresponds to 30 min. In the case that only hydrogen is used, the abnormal grain growth is also observed depending upon the composition of the sintered body, since carbon powders from the adiabatic graphite felt are scattered and are reacted with the surface of the sintered body and act as a carbon supply source thereby making a carburizing atmosphere. However, the sintered material in which the abnormal grain growth is observed under the hydrogen atmosphere is limited to a composition in which other carbides are added below 1%. The non-uniformity problem of the grain growth depending upon the position of the substrate is improved compared to under the vacuum atmosphere, but there is a significant difference in the grain size, as much as two times in accordance with the substrate type. A more critical problem is that the abnormal grain growth does not form at the corner for some compositions even in the above-described composition range. Therefore, it is impossible to implement a reproducible process. Consequently, employment of an abnormal grain growth step by introducing an active carburization is inevitable.

Figure 1B:

By introducing methane after the decarburizing reaction using hydrogen, it is possible to implement a grain growth of the surface layer irrespective of the composition of the substrate, such as the content of Co or the content of other carbide materials, and it is possible to grow the grain to a uniform size irrespective of the shape of the substrate. This is a carburization step, which is the most advantageous step according the present invention. The conditions, such as flux of methane and heat treatment condition, are similar to the decarburizing condition using hydrogen. In the carburizing step, the grain of sintered body's surface are abnormally grown, and a uniform grain growth is obtained irrespective of the position of the substrate. The growth rate of the carbide grains of the surface is different according to the composition of the sintered body, i.e. depending upon the content of other carbide material and the content of Co. As the content of other carbide materials increases or the content of Co is high, the growth rate decreases. The additional advantage of this method is that the size of the cemented carbide grain in the interior does not vary during the heat treatment while surface grain are grown above 10 μm. In the above-described two methods(vacuum treatment and only hydrogen treatment method), the cemented carbide grains are too agglomerated to be identified as individual grains especially at the substrate corners. Therefore, it is hardly expected to induce a mechanical interlocking with diamond film. FIGS. 1A and 1B illustrate a surface morphology of the sintered body based on a typical abnormal grain growth. FIG. 1A is a view illustrating well developed cemented carbide grains on the surface grown by a hydrogen-methane process, and FIG. 1B is a view illustrating a irregularly shaped grain which is processed only by a vacuum or hydrogen. In both cases, the grains are analyzed as WC grains using X-ray. In terms of the interlocking force with a diamond film, the example of FIG. 1A is more preferable. It is possible to grow a uniform abnormal grain growth on the surface of the sintered body by a decarburizing and carburizing steps. The size of the grown grain should be properly determined in a range of 5~15 μm in accordance with the thickness of the diamond film coated.

Figure 2:
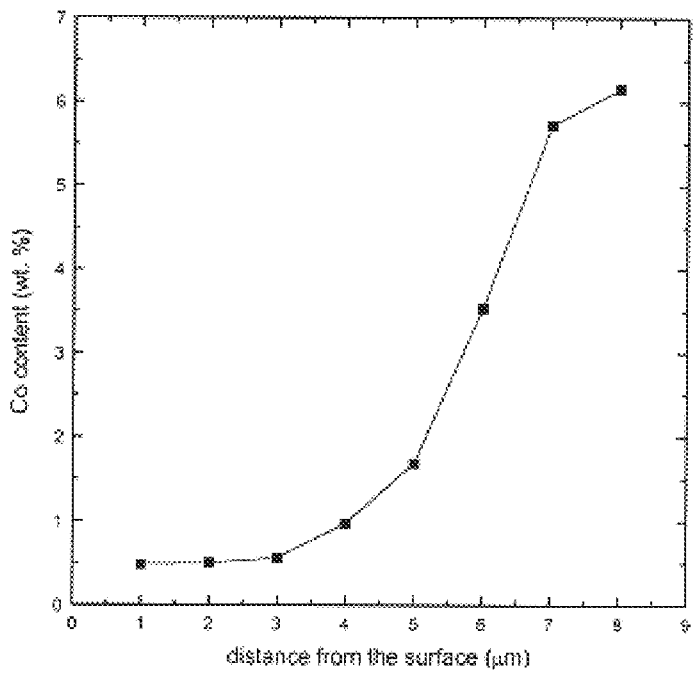
FIG. 2 is a graph illustrating a Co content variation curve obtained from a substrate surface which is heat-treated under Hydrogen (30 min)—Methane (30 min) atmosphere at 1400° C. and under 1 torr.

During the decarburizing and carburizing processes, the content of Co of the surface of the sintered body is decreased. FIG. 2 is a view illustrating a Co content variation curve on the surface of the substrate which is heat-treated under 1 torr at 1400° C. under the atmosphere of hydrogen (30 min)—methane (30 min). As shown therein, it is known that the Co content of the surface is significantly decreased. During the decarburizing and carbonizing processes, the variation of the grain size in the interior of the sintered body is not observed. The grain size of the sintered body is used in a range of 1~3μm. The same grain sizes are maintained in the interior of the sintered body even after the carburizing and decarburizing steps are performed, so that the grains in the interior of the sintered body are thought not to grow. Therefore, it is thought that the mechanical properties of the sintered body is not changed during the above-described steps according to the present invention, so that it is possible to maintain the mechanical properties of the substrate even after the coating process is performed.

The heat-treated sintered body is pretreated using diamond powder in order to implement a nucleation of the diamond. As a pretreating method, all known conventional methods, such as an ultrasonic process, scratch process, etc., may be used. Among these methods, the ultrasonic method is shown to be most effective. The ultrasonic method is performed by providing a diamond powder of below 0.5 μm into acetone, and then immersing a sintered body therein for 2 to 10 minutes. Then the sintered body is rinsed twice for 3 minutes using DI water and then is rinsed for 3 minutes using acetone and is dried with nitrogen.

Thereafter, a diamond film is deposited on the sintered body. The deposition of the diamond film can be performed by all known conventional methods such as a microwave PACVD, hot-filament CVD, DC arc-jet CVD, etc. The deposition temperature is preferably 850~950° C. when measured using an optical pyrometer by setting the emissivity at 0.43. The deposition temperature is determined based on the deposition speed and the thickness of the diamond film. As the deposition temperature increases, the deposition speed of the diamond increases, but since the possibility of the interfacial reaction caused from a surfacial diffusion of Co in the interior of the sintered body increases, the deposition temperature is required to be properly selected by considering these factors. The thickness of the diamond film is properly 10~100 μm, and in particular case of the cutting tool, preferably in a range of 10 to 50 μm.

Figure 3:
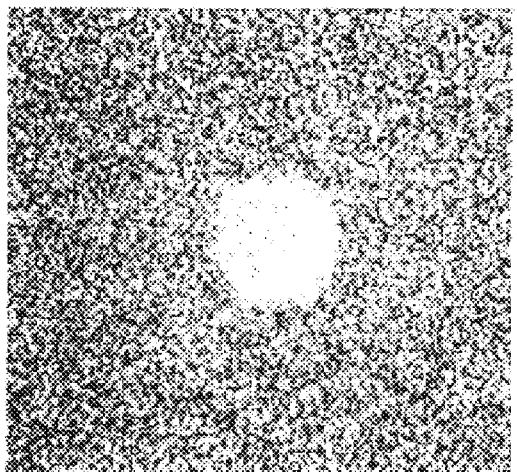
FIG. 3 is a picture illustrating an indentation mark formed under the load of 150 kg on the surface of the diamond film coated specimen for the substrate No. 5 of Table 1.

The thusly coated diamond film has an excellent adhesive force. FIG. 3 is a view illustrating an indentation mark by Rockwell A indentation test having the maximum weight of 150 kg with respect to substrate No. 5 in Table 1 which was processed under the hydrogen (30 min)—methane(30 min) atmosphere at 1 torr, 1400° C. and then was coated by a diamond film having a thickness of 30 μm. In this case, only indentation mark is observed in the diamond film without any premature flaking. Therefore, in this method, it is considered that the adhesive force is significantly enhanced.

The embodiments of the present invention will be explained in detail as follows.

EXAMPLE 1

Figure 4A:
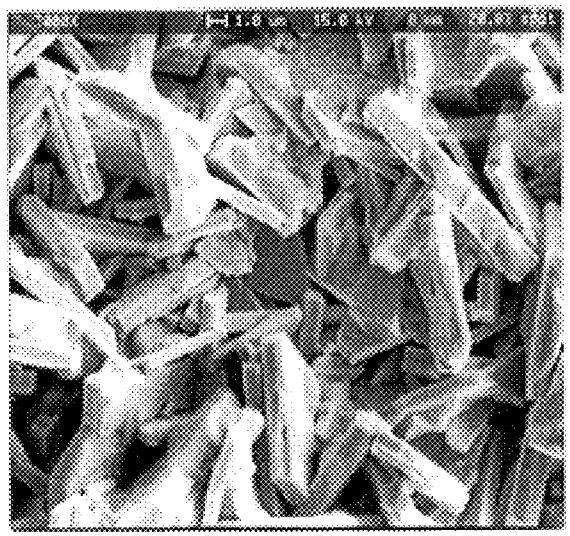
FIGS. 4a and 4b are pictures illustrating a grain shape variation at a center 4a and an edge 4b of a rectangular substrate having a composition of the substrate No. 4 of Table 1.
Figure 4B:

In the case of only using the hydrogen or vacuum processes, an example of grain growth of the substrate surface will be explained in accordance with the content of other carbides and Co contained in the substrate. As seen in Table 1, in the case of substrate No. 1, 2, 3 and 4 which have other carbides below 1% among the composition in which the content of Co were below 7% were heat-treated under a hydrogen atmosphere, a grain growth were observed on the surface of the substrate. FIGS. 4A and 4B illustrate the surface morphologies after substrate No.4 in Table 1 was heat-treated at 1400° C. for 30 minutes under a hydrogen atmosphere. FIG. 4A illustrates a central portion of the substrate, and FIG. 4B illustrates an edge portion of the same. At the central portion, a cemented carbide grain of 2~3 μm was grown to a size of 10 μm with its crystalline structure unchanged. On the contrary, at the edge portion, it was difficult to differentiate the grain structure because the growth speed of the grain was faster at the edge portion than at the center portion of the substrate. This phenomenon occurrs when heat-treating the sintered body under a hydrogen or vacuum atmosphere irrespective of the composition. That is, the grain growth morphology was different based on the portion of the substrate, and also the grain growth speed was obtained without any reproducible feature. Therefore, it was difficult to obtain a uniform adhesive force of the diamond film by the above-described method, and the same was not able to be actually adapted to the manufacturing process of the products. In addition, in the case that other carbide was below 1%, as the amount of other carbides increased, the grain growth speed and uniformity decreased. Since the grain growth was due to the abnormal grain growth, if the de-carburizing atmosphere was not created by a carbon atmosphere, it was difficult to implement a grain growth of the surface. The grain growth under the hydrogen or vacuum atmosphere was implemented due to a graphitic heating elements in the vacuum furnace and a graphitic insulating material surrounding the heating elements as a carbon source. Under the same conditions, when the substrate was heat-treated under vacuum atmosphere or hydrogen atmosphere in which the carbon source was not provided, the grain growth of the cemented carbide surface was confirmed not to occur.

EXAMPLE 2

Substrates No. 1 to 5 in Table 1 were heat-treated under a hydrogen atmosphere to be decarburized and then were carburized under a methane atmosphere. Table 2 illustrates a result obtained by measuring the grain size of the cemented carbides at the central portion and the edge portion of the substrate which were heat-treated at 1400° C., under 1 torr, for 30 minutes under the hydrogen atmosphere and methane atmosphere, respectively.

TABLE 2

Grain size variation after heat-treating for 30 min. under hydrogen atmosphere and for 30 mins. under methane atmosphere at 1400° C.

| Heat Treatment | Substrate No. | Grain Size of Central portion (μm) | Grain Size of Edge portion (μm) |
| --- | --- | --- | --- |
| 30 min (H$_2$) - 30 min (CH$_4$) | 1 | 11.5 | 10 |
| | 2 | 9.6 | 10 |
| | 3 | 10.5 | 12 |
| | 4 | 8.9 | 10 |
| | 5 | 8.6 | 11 |

As a result of the measurement, the grains at the central and edge portions of the substrate had grown uniformly to about 10 μm. There was no significant difference in the grain growth when other carbides were contained by 2% and Co was contained by 7%. Therefore, the decarburizing step using hydrogen and the carburizing step using methane was confirmed to be very effective and reproducible for the grain growth of the cemented carbide surface.

Next, a diamond film was deposited on the substrate. In order to enhance nucleation when depositing the diamond film on the substrate after the heat treatment, the substrate was immersed into an acetone solution containing diamond powders having a grain size below 0.5 μm and then was processed for 3 minutes using an ultrasonic method. Thereafter, the substrate were rinsed with DI water and acetone, and the remaining acetone was removed using nitrogen. The deposition of the diamond film was performed using a microwave plasma chemical vapor deposition method. The deposition conditions were hydrogen containing 7% methane, 4000W of microwave output, 90 torr of pressure and 950° C. of deposition temperature. The deposition time was 7 hours, and the thickness of the diamond film obtained was 30 μm.

Any premature flaking was checked in the substrates using the Rockwell indentation test. As shown in FIG. 3, the indentation was checked out but premature flaking did not occur. Therefore, in the present example, it was confirmed to effectively enhance the adhesive force of the diamond film coated on the cemented carbide.

EXAMPLE 3

Figure 5:
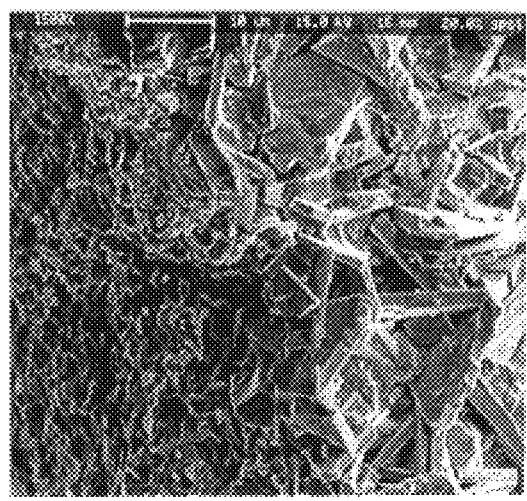
FIG. 5 is a picture of an abnormally grain-grown layer on the surface obtained by heat-treating the substrate having a composition of the substrate No. 8 of Table 1 under Hydrogen (10 min)—Methane (10 min) at 1410° C.

In example 3 according to the present invention, it was possible to obtain a certain effect of the present invention irrespective of the content of other carbides in the substrate. Substrate No.8 in Table 1 contained 10% Co and 20% other carbides, but was difficult to coat a diamond film having an excellent adhesive force by conventional method. However, according to the present invention, it was possible to obtain a grain growth of the cemented carbide surface using a decarburizing and carburizing steps. By the way, when the content of other carbides was large, a higher temperature of heat treatment was required. That is, when heat-treating the substrate in the same temperature as Example 2, the grains were slightly grown. Even when increasing the heat treatment time by 45 minutes, the grain growth was not be observed. But at a higher temperature of 1410° C., the grain growth was definitely observed. FIG. 5 is a sectional view showing the substrate which was heat-treated under a pressure of 1 torr at 1410° C. under a hydrogen atmosphere (10 min), and under a methane atmosphere (10 min), respectively. The grain sizes were uniform irrespective of the position of the substrate. In the case when the content of other carbides was large, the thickness of the grown plate-like cemented carbide grain was confirmed to become thin.

EXAMPLE 4

The substrate containing a large content of Co, which is required for providing a high transverse rupture strength, is used for a mining tool, etc. When surface hardness and wear-resistance were also given to this tool, the performance of the tool could be greatly enhanced, so that the coating of the diamond film is very important. However, it was difficult to deposit the diamond film due to the large content of Co, and by the known method, it was difficult to overcome the above-described problems for obtaining a certain adhesive force. On the contrary, according to the present invention, for the substrate No. 9 of Table 1 which had 15% of Co, it was possible to easily obtain a grain growth on the substrate surface by the steps of decarburization and carburization. At a temperature of 1400° C., the substrate was decarburized for 30 minutes under a hydrogen atmosphere and was carburized for 30 minutes under a methane atmosphere. The grain size of the cemented carbide was grown to be about 20 μm. The abnormal grain growth of the surface grains was more easily implemented in the case of the substrate containing a large content of Co, than the substrate containing a large content of other carbides.

EXAMPLE 5

In the conventional method, a surface grain growth of cemented carbide composed of sub-micron grains was not reported. According to the present invention, it was possible to effectively grow the grain on the surface by increasing the heat treatment temperature by 20 to 50° C. based on the same method as Examples 1 to 4 of the present invention and by chemically etching the surface of heat-treated substrate and thereby removing a predetermined amount of Co from the surface. Increasing the heat treatment temperature to 1450° C., a WC grain growth of 4~7 μm was obtained by is 1 hour heat treatment under a hydrogen and methane atmosphere. In the case that the content of Co is above 15%, the resultant substrate was etched in a solution of $H_2O_2+H_2SO_4$ for 30 seconds to 2 minutes for thereby removing a certain amount of Co, so that it was possible to easily implement a grain growth based on the same heat treatment method as Examples 1 to 4.

CUTTING TEST RESULT

Figure 6:
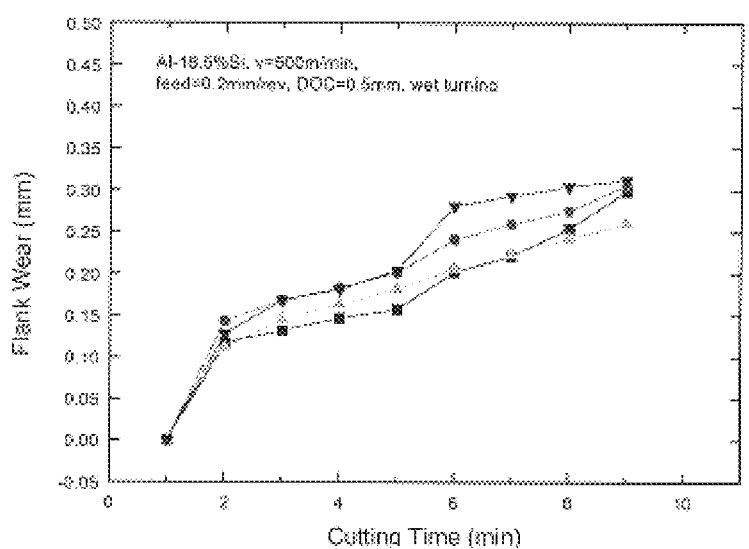
FIG. 6 is a graph illustrating a cutting performance of a diamond film coated cutting tool when cutting a workpiece of Al-18.5% Si at a cutting speed of 500 m/min, a transfer speed of 0.2 mm/rev, and a cutting depth of 0.5 mm based on a wet cutting condition.

A cutting test was performed using the substrates which were manufactured by the above-described methods. The substrate Nos. 1, 2 and 5 as shown in Table 1 were used for the test. The thickness of the coated diamond film were 20 μm, 30 μm and 40 μm, respectively. In the indentation test by a load of 150 Kg, all the substrate coated with diamond film did not have any premature flaking problem. The shape of the substrates were SPGN 120308 and SPGN 120312, and the workpiece had a cylindrical shape and was composed of Al-18.5% Si. The cutting condition was a 500 m/min cutting speed, a 0.2 mm/rev transfer speed, a 0.5 mm and a 1 mm cutting depth based on the wet cutting and dry cutting operation. FIG. 6 illustrates the wet cutting test result of the 30 μm diamond-coated tool for the SPGN 120308 of Nos. 1 to 4 of Table 1. The diamond was deposited at 950° C. for 11.5 hours under a hydrogen atmosphere by microwave plasma chemical vapor deposition. The cutting depth was 1 mm. The tool's cutting operation was confirmed to be performed through a normal wear, and the cemented carbide substrate was not exposed even after 27 minute machining. The four substrates showed a similar wear speed of about 0.004 mm/min, which means that the tools have a good cutting performance. The roughness of the workpiece was 1.4~1.6 μm after 27 minute machining. As the thickness of the diamond film became thin, the surface roughness of the workpiece was decreased. When the thickness was 30 μm, the surface roughness of the workpiece was in a range of 1.0~1.2 μm. Since this surface roughness variation was caused by the increase of the diamond crystal size with the increase of the thickmess, these problems was significantly decreased by improving a surface roughness of the diamond film by re-neucleation on the surface of the diamond film.

Figure 7A:
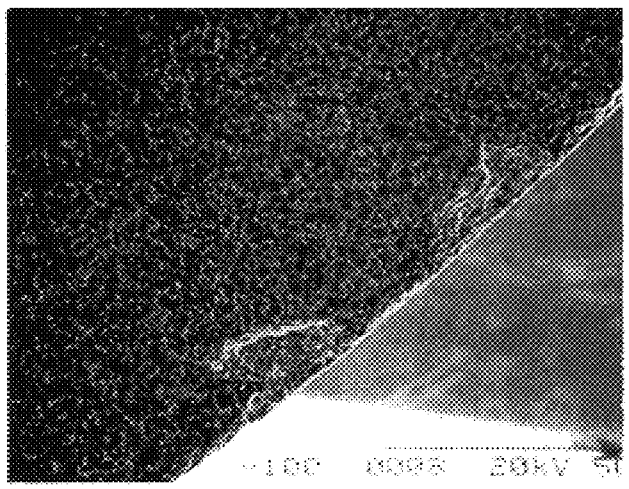
FIGS. 7A and 7B are pictures of cutting edges of polycrystalline tool and diamond film coated tool respectively, after cutting a workpiece of WC-13% Co formed by a cold isostatic pressing method.
Figure 7B:
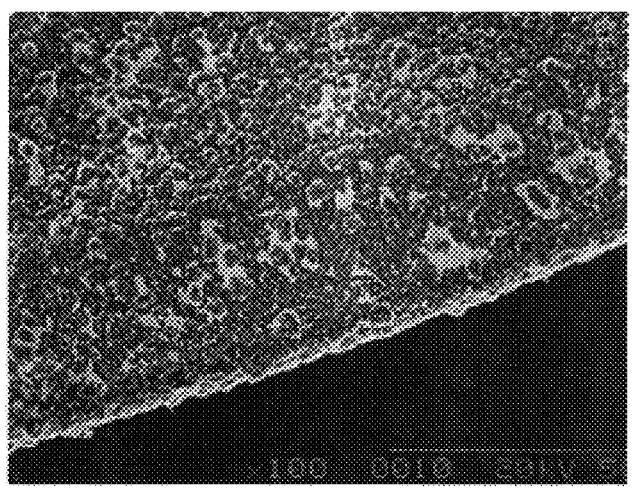

In addition, the cutting performance of the insert tool which was coated with the diamond film according to the present invention was compared with that of the sintered polycrystalline diamond (PCD) cutting tool, in regard to machining the cold isostatic-pressed(CIP) cemented carbide (WC-13% Co). The cutting speed was 180 m/min, and the transfer speed was 0.75~1.25 mm/rev. The height of the workpiece was 200 mm, and the diameter was 500 mm. The cutting performance was compared by the morphology of the tool edge portion after machining a certain number of the workpieces. The RCMT 1204 type tool was used, and the thickness of the diamond film was 20 μm. FIGS. 7A and 7B are pictures which illustrate the tool edge portion after machining the cold isostatic-pressed WC-13% Co workpiece. FIG. 7A illustrates the edge portion of the sintered PCD tool after machining 10 workpieces, and FIG. 7B illustrates the edge portion of the diamond film coated tool according to the present invention after machining 40 workpieces. In the case of the PCD tool, a small chipping problem occurred, and the wear of the tool was proceeded. However, in the case of the diamond film coated tool according to the present invention, the wear was not observed even after machining 40 workpieces. In regard to the CIP cemented carbide material, the diamond film coated tool is confirmed to have an excellent cutting performance.

According to the present invention, as the abnormal grain growth is occurred to increase the surface roughness of the substrate and then the diamond film is deposited, the adhesive force of the deposited film increases. Also, it is possible to manufacture a cutting tool having an excellent cutting performance.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A method for manufacturing a diamond film coated cutting tool, comprising the steps of heat-treating a surface of a cemented carbide substrate under a decarburizing atmosphere until the surface changes to a η phase;

heat-treating the surface-decarburized cemented carbide substrate under a carburized atmosphere; and depositing a diamond film on the carburized surface of the cemented carbide substrate.

2. The method of claim 1, further comprising a step of pre-treating the surface of the cemented carbide substrate by depositing a diamond powder after the carburizing heat-treating step.

3. The method of claim 1, wherein said decarburization and carburization heat-treating steps are performed at a temperature between 1300 to 1500° C.

4. The method of claim 3, wherein said decarburization and carburization heat-treating steps are performed at a pressure between 0.1 torr to about 1 atmosphere.

5. The method of claim 1, wherein said decarburization heat-treating step is performed under one of a (a) hydrogen atmosphere and (b) an oxygen atmosphere.

6. The method of claim 1, wherein said carburized heat-treating step is performed under a hydrocarbon atmosphere.

* * * * *